United States Patent
Marcyk et al.

[11] Patent Number: 6,103,625
[45] Date of Patent: Aug. 15, 2000

[54] USE OF A POLISH STOP LAYER IN THE FORMATION OF METAL STRUCTURES

[75] Inventors: Gerald T. Marcyk; Joseph M. Steigerwald, both of Beaverton, Oreg.

[73] Assignee: Intel Corporation, Santa Clara, Calif.

[21] Appl. No.: 09/001,549

[22] Filed: Dec. 31, 1997

[51] Int. Cl.$^7$ .................................................. H01L 21/302
[52] U.S. Cl. ............................................ 438/691; 438/692
[58] Field of Search ................................. 438/689, 690, 438/691, 692

[56] References Cited

U.S. PATENT DOCUMENTS

| | | | |
|---|---|---|---|
| 5,356,513 | 10/1994 | Burke et al. | 156/636 |
| 5,516,729 | 5/1996 | Dawson et al. | 437/228 |
| 5,633,207 | 5/1997 | Yano et al. | 438/645 |
| 5,776,833 | 7/1998 | Chen et al. | 438/672 |
| 5,798,302 | 8/1998 | Hudson et al. | 438/693 |

OTHER PUBLICATIONS

Joshi, R.V.; "A New Damascene Structure for Submicrometer Interconnect Wiring"; *IEEE Electron Device Letters*, vol. 14, No. 3, Mar. 1993 pp. 129–132.

Steigerwald, J.M., et al.; "Pattern Geometry Effects in the Chemical–Mechanical Polishing of Inlaid Copper Structures"; *J. Electrochem. Soc.*, Col. 141, No. 10, Oct. 1994; pp.2842–2847.

*Primary Examiner*—Benjamin L. Utech
*Assistant Examiner*—Kin-Chan Chen
*Attorney, Agent, or Firm*—Blakely, Sokoloff, Taylor & Zafman LLP

[57] ABSTRACT

The present invention describes a method of forming an interconnect structure. An insulating layer is formed, and then an opening is formed in the insulating layer. Next, a conductive layer is formed over the insulating layer and in the opening. A polishing stop layer is then formed over the conductive layer. The polishing stop layer and the conductive layer are then polished; however, the polishing stop layer is polished at a slower rate than the conductive layer.

31 Claims, 3 Drawing Sheets

USE OF A POLISH STOP LAYER IN THE FORMATION OF METAL STRUCTURES

BACKGROUND OF THE INVENTION

1. Field of the Invention

The present invention relates generally to manufacturing semiconductor processing devices. More specifically, the present invention pertains to a self-planarization technique.

2. Description of Related Art

During the process of manufacturing semiconductor devices, electrically conductive materials patterned in electrical circuitry are layered over a semiconductor substrate. The electrically conductive materials, such as copper, are in different and non-contiguous planes. Vias or pathways connect the various layers of electrically conductive materials. An insulator or interlayer dielectric is placed between the separate planes of conductive material within the vias and also within the trenches and the circuit pattern of a layer of conductive material. Moreover, interconnects that are a conductive connection between two or more semiconductor devices are also formed.

In general, an interconnect can be formed by first depositing a metal into an opening or trench formed in an interlayer dielectric. The metal is typically planarized using chemical-mechanical polishing (CMP), which has a chemical component (e.g., slurries) and a mechanical component (e.g., a polishing pad). A balance between these two components is necessary to obtain good results. In general, excess metal (deposited outside of the opening) is polished (or removed) using a CMP process until the top surface of the metal is substantially planar with the interlayer dielectric. Unfortunately, wide metal structures (e.g., with a width of tens of microns) formed from a CMP process suffer from a phenomena termed "dishing" in which the surface of the metal is recessed below the interlayer dielectric in a dish or bowl shape. This degrades device performance and reliability.

An example of "dishing" can be seen in a prior art embodiment shown in FIGS. 1A, 1B, 1C. In FIG. 1A, a metal layer 103 is conformally deposited into narrow lines 107 and wide metal line 105, which are patterned into interlayer dielectric (ILD) 101. ILD 101 is disposed over a substrate 100. Substrate 100 typically contains active and passive semiconductor devices, at and within substrate 100. The substrate 100 can also be one of the layers in a multi-level interconnect.

Next, as shown in FIG. 1B, a CMP process is applied. Metal layer 103 is pre-planarized over narrow lines 107 but not over wide metal line 105. Because wide metal line 105 is wider than the thickness of deposited metal layer 103, the height of conductive layer 103 formed over wide metal line 105 is lower than its height over narrow lines 107. Consequently, areas with narrow features (e.g., narrow lines 107) will be cleared of the metal overburden more slowly than areas with wide features (e.g., wide metal line 105). As a result, the overburden is removed first from a wide feature, such as wide metal line 105 resulting in more overpolishing of wide metal line 105 than of narrow lines 107.

FIG. 1C illustrates the overpolish step, which is necessary to insure that the portion of metal layer 103 disposed above ILD 101 is removed. In general, the longer the overpolish period, then the greater the degree of dishing. During the overpolish step, the polish pad usually reaches (or "squeezes") into wide metal line 105 to remove material within the recess resulting in dishing. In contrast, narrow lines 107 are polished without any undesirable dishing. The polish pad does not remove material within the recess in narrow lines 107, which allows a planar formation of metal layer 103 over narrow lines 107.

Thus, it is desirable to minimize or reduce dishing during the chemical-mechanical polishing of a wide integrated circuit feature.

SUMMARY

A method of forming an integrated circuit structure comprising the following steps is described. An opening is formed in a dielectric that is disposed over a substrate. A conductive layer is formed over the opening and the dielectric. A polishing stop layer is then formed over the conductive layer, wherein the polishing stop layer can be removed at a slower rate than the conductive layer.

BRIEF DESCRIPTION OF THE DRAWINGS

The present invention is illustrated by way of example and not by limitation in the figures of the accompanying drawings in which like references indicate similar elements.

DETAILED DESCRIPTION

A method of forming metal structures by chemical-mechanical polishing using a polishing stop layer to reduce dishing is described. In the following description, numerous specific details are given to provide a thorough understanding of the invention. But it will be apparent to one skilled in the art that the invention may be practiced without these specific details. Moreover, in some instances, well-known semiconductor equipment and processes have not been set forth in detail in order not to unnecessarily hide the present invention.

The present invention is a method of forming an integrated circuit structure, such as metal lines and metal interconnects. The present inventive method comprises the following steps. An opening is formed in a dielectric. A conductive layer is then formed over the opening and the dielectric. Next, a polishing stop layer is formed over the conductive layer. The polishing stop layer comprises a material that can be polished slower than the conductive layer. Thus, the polishing stop layer is removed at a slower rate than the conductive layer during a subsequent chemical-mechanical polishing (CMP) step.

The present invention reduces the degree of dishing through the use of a polishing stop layer that is deposited over a conductive layer before polishing the conductive layer. Because the polishing stop layer can be polished at a significantly slower rate than the conductive layer, the polishing stop layer can decrease the dishing effect. In addition, because of the planarizing nature of chemical-mechanical polishing, the polishing stop layer is removed from the high areas faster than from the low areas. High areas are defined as areas with structures that have a greater height than the structures located in the low areas. Once the polishing stop layer is removed from the high areas, the faster-polishing conductive layer in the high areas, is removed quickly, while the relatively slower-polishing stop layer remains in the low areas to prevent or reduce the removal of the portion of the conductive layer located in the low areas. Thus, the planarization efficiency of the polish process increases because the polish rate of the low areas is suppressed. The improved planarization efficiency yields a more uniformly planar surface at the end of the polishing process than under prior art processes. And the conductive layer (e.g., copper) is also planarized more consistently resulting in less dishing and leaving more metal for conduction. Thus, greater device performance can be obtained under the present invention than under the prior art method.

Figure 1A:
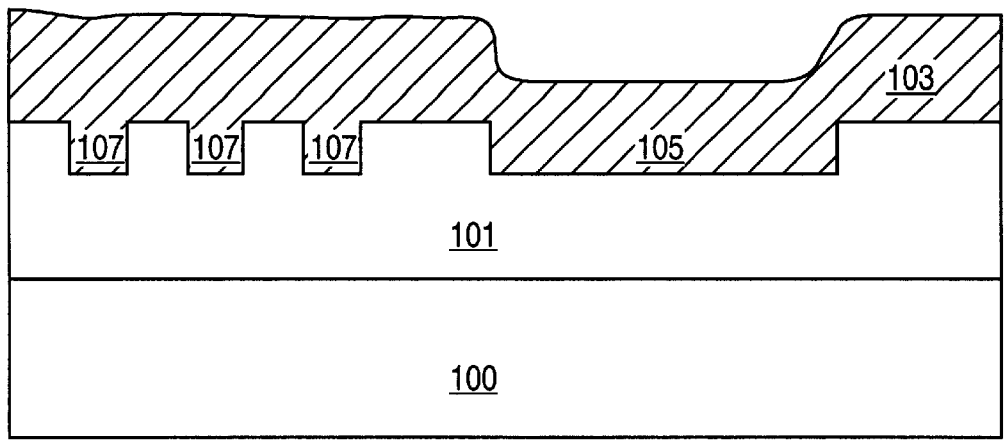
FIG. 1A illustrates a prior art embodiment for forming an interconnect.
Figure 1B:
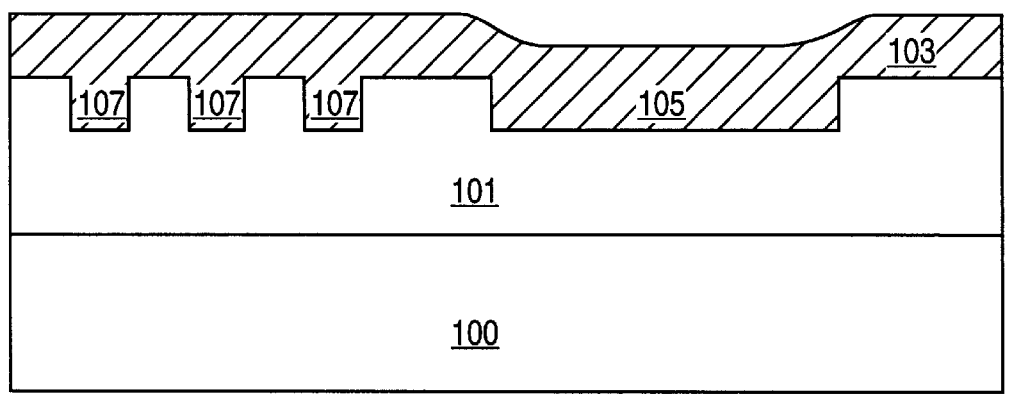
FIG. 1B illustrates polishing the substrate of FIG. 1A.
Figure 1C:
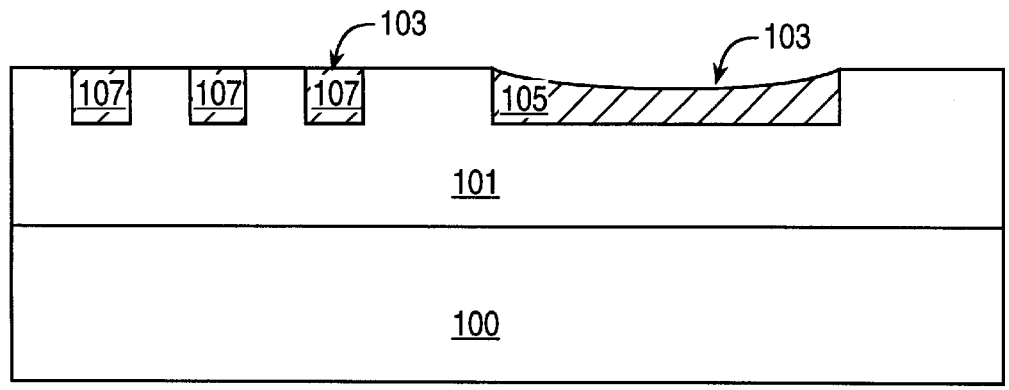
FIG. 1C illustrates the over-polishing of the substrate shown in FIG. 1B.
Figure 2A:
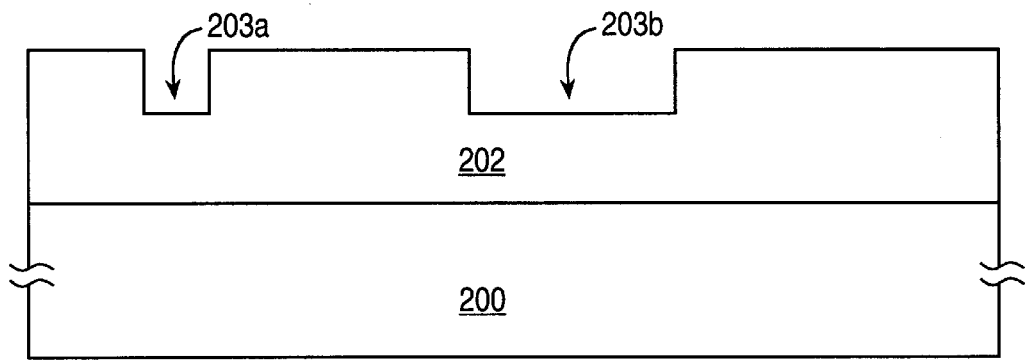
FIG. 2A is a cross-sectional view of an insulating layer and a substrate which can be used in one embodiment of the present invention.
Figure 2B:
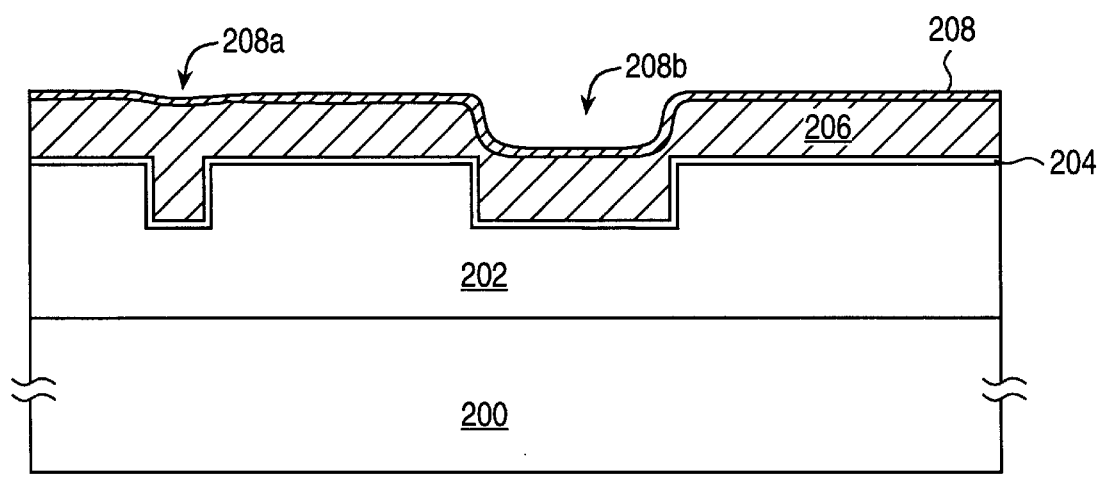
FIG. 2B illustrates the formation of several layers over the substrate shown in FIG. 2A.
Figure 2C:
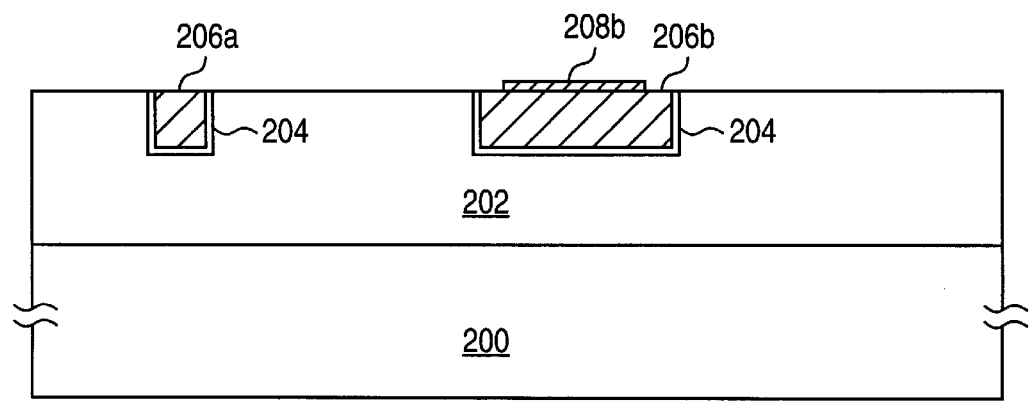
FIG. 2C is a cross-sectional view illustrating the polishing of the substrate shown in FIG. 2B.

FIGS. 2A, 2B, and 2C are a cross-sectional view illustrating one embodiment of the present inventive method. Referring to FIG. 2A, a first insulating layer or interlayer dielectric (ILD) 202 is formed over a substrate 200. The substrate 200 typically contains active and passive semiconductor devices, at and within the substrate 200. The substrate 200 can also be one of the layers in a multilevel interconnect. First interlayer dielectric 202 can be silicon dioxide or any other dielectric such as a low-K polymer. Interlayer dielectric 202 can be deposited using standard chemical vapor deposition (CVD) methods or other applicable techniques. A narrow opening 203a and a wide opening 203b are formed within first interlayer dielectric 202 using standard etching techniques. Openings can have widths in the range of between 0.2 $\mu$m to 100 $\mu$m and have aspect ratios, which is height/width, from between 2:1 to 1:100. The present invention helps reduce dishing in openings that have a width ranging from sub-0.5 $\mu$m (micrometer or micron) to hundreds of micrometers.

In FIG. 2B, an adhesion layer 204 is conformally formed or deposited over interlayer dielectric 202. The formation of adhesion layer 204 is optional depending on the identity of the subsequently formed conductive layer 206, which is formed or conformally deposited over adhesion layer 204. For example, if conductive layer 206 is copper, then adhesion layer 204 is probably required. It is preferred that adhesion layer 204 have a thickness of less than 100 Angstroms. In one embodiment, adhesion layer 204 comprises a material selected from the group consisting of titanium, titanium nitride and tantalum, tantalum nitride, magnesium, and aluminum. It will be appreciated that other applicable materials can also be used to form adhesion layer 204. Conductive layer 206 is formed over adhesion layer 204 and in openings 203a and 203b. Conductive layer 206 comprises a material selected from the group consisting of aluminum, copper, tungsten, silver, gold, copper and their respective alloys. In one embodiment, conductive layer 206 is preferably formed of a copper alloy or an aluminum alloy. Conductive layer 206 can have, in one embodiment, a thickness that ranges from about 0.25 $\mu$m to about 2.0 $\mu$m.

It will be appreciated, in one embodiment, that there can be a lower limit to the applicability of the present invention. The lower limit for applicability of the present invention is when there is no formation of a differential height of the as deposited conductive layer 206. The formation of a differential step height is determined by the aspect ratio of the openings as well as by conductor deposition technique. There is no upper limit in terms of the width of an opening formed in ILD 202. It will, however, be appreciated that as a wide opening becomes even wider, then the low area over the wide opening begins to be treated more like a high area to the polishing pad.

In a preferred embodiment, conductive layer 206 is approximately as thick as the depth of an opening (e.g., 203b) formed in interlayer dielectric 202. It will be appreciated, however, that conductive layer 206 can be thicker than the depth of openings 203b. Next, polishing stop layer 208 can be conformally formed or deposited over conductive layer 206. It is preferred, in one embodiment, that a portion of polishing stop layer 208 remain over a wide feature after planarization of polishing stop layer 208 and conductive layer 206. In one embodiment, polishing stop layer 208 comprises a material selected from the group consisting of a nitride, such as silicon nitride and an oxide, such as silicon oxide, and a refractory metal, such as tungsten (W) or molybdenum (Mo), and amorphous carbon. In one embodiment, polish stop layer 208 can have a thickness in the range of about 300 Å–1000 Å.

It is also preferable that polish stop layer 208 be formed of a material that can be polished or removed at a slower rate than conductive layer 206. This polishing rate differential can also be accomplished by the choice of slurries and polishing pad(s) used during CMP of polishing stop layer 208 and conductive layer 206. The key is that during chemical-mechanical polishing (CMP) of polishing stop layer 208 and conductive layer 206, polishing stop layer 208 can be polished at a slower rate than conductive layer 206. In addition, polishing stop layer 208 is generally removed faster from, for example, high area 208a than from, for example, low area 208b. This is because the polishing pad can apply more pressure at high area 208a than at low area 208b because high area 208a has a greater area of uniform planarity than low area 208b.

Next, as shown in FIG. 2C, a narrow opening 203a formed in first interlayer dielectric 202 can be planarized such that its top surface is substantially planar with the top surface of interlayer dielectric 202. The portion of polishing stop layer 208 over narrow feature 206a is completely removed. In contrast, a portion of polishing stop layer 208 can remain over wide feature 206b formed in interlayer dielectric 202. Wide feature 206b can be, for example, a metal line or a metal interconnect. The polish stop layer 208 disposed over the portion of conductive layer 206 formed in wide feature 206b, helps reduce dishing or prevent removal of conductive layer 206 from wide feature 206b. It is to be appreciated, that if the planarization step is continued, polishing stop layer 208 can be removed without causing dishing in wide feature 206b. In other words, polishing stop layer 208 can remain over wide feature 206b when the planarization or polishing process ends or it 208 can be removed.

It is preferred that polishing stop layer 208 be thick enough to prevent or reduce the dishing of a wide feature (e.g., 206b) formed in interlayer dielectric 202. In a preferred embodiment, polishing stop layer 208 and conductive layer 206 are planarized using a chemical-mechanical polishing process. Chemical mechanical polishing process generally use slurries comprised of an abrasive agent such as but not limited to silicon oxide, aluminum oxide, or cerium oxide plus a chemical agent such as bases (potassium hydroxide or ammonium hydroxide) or acids (nitric acid). Additionally chemical mechanical process generally use polishing pads made from hard urethanes or napped cloths. It will be appreciated that the slurries and type of polishing pad used, either alone or in combination, are chosen so that polishing stop layer 208 is polished at a slower rate than conductive layer 206.

Figure 3A:
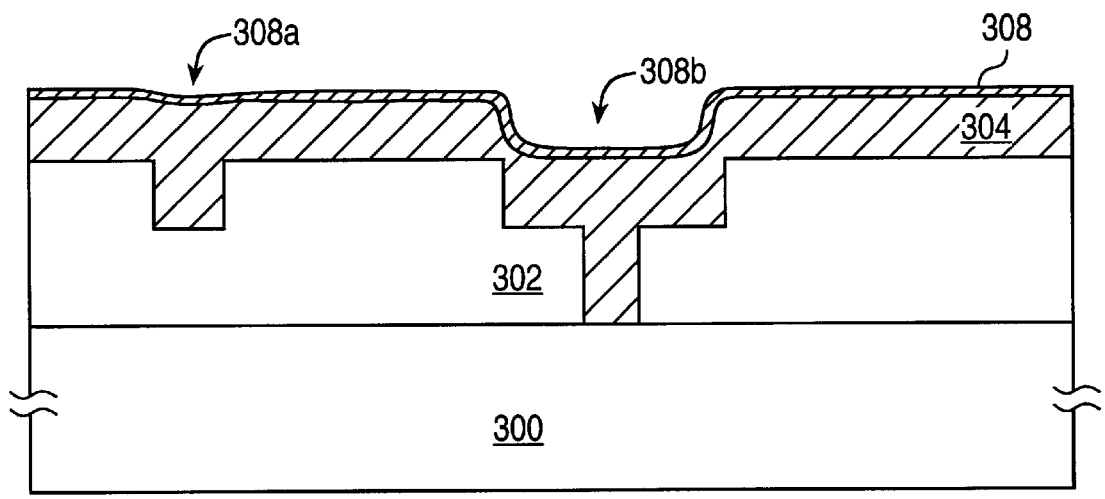
FIG. 3A is a cross-sectional view illustrating an insulating layer and a substrate which can be used in another embodiment of the present invention.
Figure 3B:
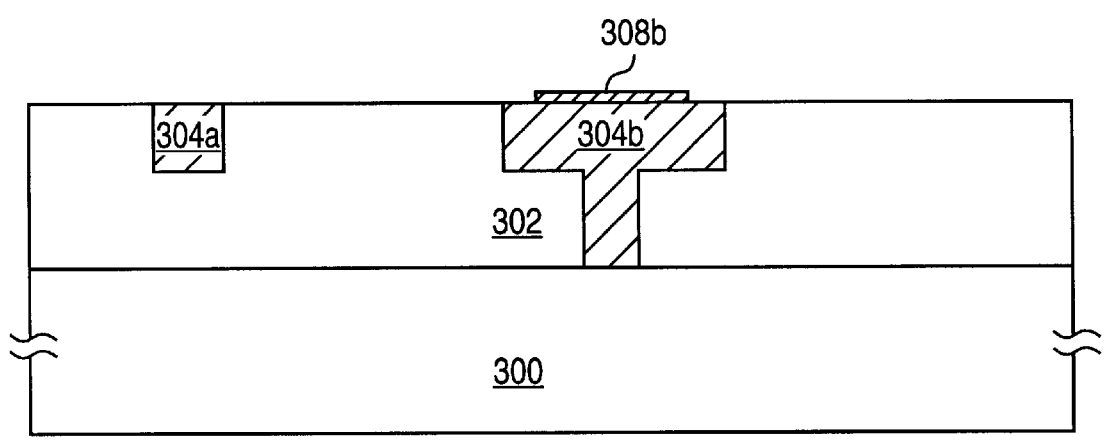
FIG. 3B illustrates the polishing of the substrate shown in FIG. 3A.

FIGS. 3A, 3B, and 3C illustrate another embodiment of the present invention. The main difference between FIGS. 3A and 2B is that in FIG. 3A, an interconnect structure formed of conductive layer 304 is formed through interlayer dielectric 302, and is also electrically connected to substrate 300. A polishing stop layer 308 is conformally deposited or formed over conductive layer 304. Conductive layer 304 can be formed or deposited over a narrow opening and a wide opening formed in interlayer dielectric 302. Interlayer dielectric 302 is formed over substrate 300. Substrate 300 typically contains active and passive semiconductor devices, at and within the substrate 300. Or substrate 300 can also be one of the layers in a multi-level interconnect.

In one embodiment, interlayer dielectric 302 can be silicon dioxide or any other applicable insulating layer. In addition, conductive layer 304 comprises a material selected from the group consisting of aluminum, copper, tungsten, silver, gold, and their respective alloys. In addition, in one embodiment, polishing stop layer 308 comprises a material selected from the group consisting of a nitride, such as silicon nitride, and an oxide, such as silicon dioxide, and a refractory metal (e.g., Mo), and amorphous carbon. A high area 308a formed over a narrow feature (e.g., 304a) is generally polished faster than a low area 308b formed over a wide feature (e.g., 304b).

After the substrate in FIG. 3A is chemically-mechanically polished, the resulting structure is shown in FIG. 3B. Polishing stop layer 308 remains over wide feature 304b formed in interlayer dielectric 302, but is removed over narrow feature 304a. Because polishing stop layer 308 is formed higher in high area 308a and with greater planarity over a narrow feature than in low area 308b over a wide feature, polishing stop layer 308 is removed first over narrow feature 304a during CMP of conductive layer 304 and polishing stop layer 308.

In addition, the planarizing nature of chemical-mechanical polishing causes polishing stop layer 308 to be removed more quickly from high area 308a than from low area 308b. Once polishing stop layer 308 is removed from high area 308a, the portion of conductive layer 304 underneath high area 308a will be polished more quickly than the portion of polishing stop layer 308 remaining over low area 308b. Polishing stop layer 308 can be completely removed over narrow feature 304a. Consequently, because polishing stop layer 308 can be polished at a slower rate than conductive layer 304, a portion of polishing stop layer 308 can remain over wide feature 304b. It will be appreciated, however, that the CMP process can be extended until the portion of polishing stop layer 308 remaining over the upper surface of wide feature 304b is also removed.

It will also be appreciated that although an adhesion layer is not shown in FIGS. 3A and 3B, an adhesion layer can be formed or deposited prior to forming or depositing conductive layer 304. The need of an adhesion layer is determined by the identity of conductive layer 304. For example, if conductive layer 304 is copper, then an adhesion layer can be utilized. In one embodiment, the adhesion layer comprises a material selected from the group consisting of titanium, titanium nitride, tantalum, tantalum nitride, magnesium and aluminum. Moreover, it will be appreciated that the slurries and the type of polishing pad selected will allow polishing stop layer 308 to be polished at a slower rate than conductive layer 304.

In the above description, numerous specific details were given to be illustrative and not limiting of the present invention. It will be evident to one skilled in the art that the invention may be practiced without these specific details. Moreover, in some instances, well-known semiconductor equipment and processes have not been set forth in detail in order to not unnecessarily obscure the present invention. Thus, the method of the present invention is defined by the appended claims.

What is claimed is:

1. A method of forming an integrated circuit structure, comprising:

forming an opening having a depth in a interlayer dielectric that is disposed over a substrate;

forming a conductive layer over said opening and said interlayer dielectric wherein said conductive layer is formed to a thickness greater than or equal to said depth of said opening;

forming a polishing stop layer over said conductive layer; and polishing said polishing stop layer and said conductive layer, wherein said polishing stop layer is polished at a slower rate than said conductive layer.

2. A method of forming an interconnect structure, comprising:

forming an insulating layer;

forming an opening having a depth in said insulating layer;

forming a conductive layer over said insulating layer and in said opening wherein said conductive layer is formed to a thickness greater than or equal to said depth of said opening;

forming a polishing stop layer over said conductive layer; and polishing said polishing stop layer and said conductive layer, wherein said polishing stop layer is polished at a slower rate than said conductive layer.

3. The method of claim 2, further including the step of:

forming an adhesion layer over said opening and over said insulating layer prior to the step of forming a conductive layer.

4. The method of claim 3, wherein said adhesion layer comprises a material selected from the group consisting of titanium, titanium nitride, tantalum, tantalum nitride, magnesium, and aluminum.

5. The method of claim 3, wherein said conductive layer is selected from the group consisting of copper, aluminum, gold, silver and tungsten.

6. The method of claim 2, wherein said conductive layer comprises a material selected from the group consisting of aluminum, copper, tungsten, silver, gold, and their respective alloys.

7. The method of claim 2, wherein said opening has a width in the range of sub 0.5 microns to hundreds of microns.

8. The method of claim 2, wherein said opening causes a differential height to occur in said conductive layer before the step of planarizing.

9. The method of claim 2, wherein said polishing step includes polishing said slow polishing layer and said conductive layer until a top surface of said conductive layer is substantially planar and exposed.

10. The method of claim 2, wherein said polishing step includes polishing said slow polishing layer and said conductive layer until said polishing stop layer remains only over a conductive layer filled opening.

11. The method of claim 2, wherein said conductive layer has a uniform thickness throughout said opening after said polishing step.

12. The method of claim 2, wherein said polishing stop layer comprises a material selected from the group consisting of a nitride, an oxide, a refractory metal, and amorphous carbon.

13. The method of claim 2, wherein said polishing step utilizes a chemical-mechanical polishing process.

14. A method of forming an interconnect structure, comprising:

depositing an interlayer dielectric;

forming an opening having a depth in said interlayer dielectric;

forming a conductive layer over said opening and over said interlayer dielectric wherein said conductive layer is formed to a thickness greater than or equal to said depth of said opening;

forming a polishing stop layer over said conductive layer; and polishing said polishing stop layer and said conductive layer until said conductive layer is substantially planar with said interlayer dielectric, wherein said polishing stop layer is polished at a substantially slower rate than said conductive layer.

15. The method of claim 14, wherein said interlayer dielectric is an oxide.

16. The method of claim 14 wherein said interlayer dielectric is a low K polymer dielectric.

17. The method of claim 14, wherein said opening causes a differential height to occur in said conductive layer.

18. The method of claim 14, wherein said opening has a width that is at least twice the thickness of said conductive layer before the polishing step.

19. The method of claim 14, wherein said conductive layer comprises a material selected from the group consisting of aluminum, copper, tungsten, silver, gold, and their respective alloys.

20. The method of claim 14, wherein said polishing stop layer comprises a material selected from the group consisting of a nitride, an oxide, a refractory metal, and amorphous carbon.

21. The method of claim 14, further comprising:
forming an adhesion layer over said opening and over said interlayer dielectric.

22. The method of claim 14, wherein said polishing step forms a metal line.

23. The method of claim 14, wherein said polishing step forms a metal interconnect.

24. A method of forming an integrated circuit structure, comprising:

forming a first opening and a second opening in a dielectric layer that is disposed over a substrate, wherein the second opening is wider than the first opening;

forming a conductive layer over the first and second openings and over the dielectric layer, wherein a first height of the conductive layer formed over the first opening is greater than a second height of the conductive layer formed over the second opening;

forming a polishing stop layer over the conductive layer;

selecting a slurry and a polishing pad so that the polishing stop layer is polished at a slower rate than the conductive layer; and polishing the polishing stop layer and the conductive layer until said conductive layer in said first opening is planar with the dielectric.

25. The method of claim 24, wherein the second opening causes a differential height to occur in said conductive layer.

26. The method of claim 24, wherein the polishing stop layer still remains over a conductive layer filled second opening after the polishing step.

27. The method of claim 24, wherein the second opening has a width in the range of hundreds-of-microns.

28. The method of claim 24, wherein the polishing stop layer comprises a material selected from the group consisting of a nitride, an oxide, a refractory metal, and amorphous carbon.

29. The method of claim 24, wherein said conductive layer comprises a material selected from the group consisting of aluminum, copper, tungsten, silver, gold, and their respective alloys.

30. The method of claim 24, further comprising:
forming an adhesion layer over the first and second openings and over the dielectric layer.

31. The method of claim 24, wherein the conductive layer is polished until it is substantially planar with the dielectric layer and said polishing stop layer is removed.

* * * * *

UNITED STATES PATENT AND TRADEMARK OFFICE
CERTIFICATE OF CORRECTION

PATENT NO. : 6,103,625
DATED : August 15, 2000
INVENTOR(S) : Marcyk et al.

It is certified that error appears in the above-identified patent and that said Letters Patent is hereby corrected as shown below:

<u>Column 5,</u>
Line 6, delete ", and 3C".

Signed and Sealed this

Twenty-eighth Day of May, 2002

*Attest:*

*Attesting Officer*

JAMES E. ROGAN
*Director of the United States Patent and Trademark Office*